US006438818B1

(12) United States Patent
Costa

(10) Patent No.: US 6,438,818 B1
(45) Date of Patent: Aug. 27, 2002

(54) ELECTRICAL TERMINAL IMPLEMENTATION DEVICE

(76) Inventor: Larry J. Costa, 55613 Currant Rd., Mishawaka, IN (US) 46545

(*) Notice: Subject to any disclaimer, the term of this patent is extended or adjusted under 35 U.S.C. 154(b) by 0 days.

(21) Appl. No.: 09/510,281

(22) Filed: Feb. 21, 2000

(51) Int. Cl.[7] .......................... H05K 3/34; B23P 23/04; B23Q 41/00

(52) U.S. Cl. ...................... 29/564.6; 29/566.2; 29/741; 29/33 M; 29/705; 901/42; 228/49.5

(58) Field of Search ............................ 29/564.7, 564.6, 29/566.2, 566.3, 33 M, 741, 839, 840, 843, 739, 759, 705; 901/42, 41; 228/33, 44.7, 49.5, 248.1, 207, 223, 212, 213, 180.21, 205, 103, 104

(56) References Cited

U.S. PATENT DOCUMENTS

| | | | | | |
|---|---|---|---|---|---|
| 3,739,446 | A | * | 6/1973 | Long, Jr. et al. | 29/566.2 |
| 4,003,125 | A | * | 1/1977 | Wallick | 29/753 |
| 4,214,120 | A | * | 7/1980 | Jones, Jr. et al. | 29/591 |
| 4,429,559 | A | * | 2/1984 | dePuglia et al. | 29/566.3 |
| 4,503,609 | A | * | 3/1985 | Mackay | 29/843 |
| 4,578,736 | A | * | 3/1986 | Brown | 29/25.42 |
| 4,602,429 | A | * | 7/1986 | Nicoll | 29/564.6 |
| 4,672,742 | A | * | 6/1987 | Juan | 29/840 |
| 4,740,133 | A | * | 4/1988 | Kawano | 901/42 |
| 4,794,689 | A | * | 1/1989 | Seno et al. | 29/740 |
| 4,796,357 | A | * | 1/1989 | Smith | 29/840 |
| 4,980,971 | A | * | 1/1991 | Bartschat et al. | 29/740 |
| 5,038,466 | A | * | 8/1991 | Marozsan et al. | 29/840 |
| 5,579,574 | A | * | 12/1996 | Colleran et al. | 29/840 |
| 5,730,608 | A | * | 3/1998 | Legrady | 439/78 |
| 6,113,248 | A | * | 9/2000 | Mistopoulos et al. | 362/240 |
| 6,196,439 | B1 | * | 3/2001 | Mays et al. | 228/6.2 |

OTHER PUBLICATIONS

Metals Handbook, 2nd ed., 1998, pp. 1123–1124.*

* cited by examiner

*Primary Examiner*—A. L. Wellington
*Assistant Examiner*—Erica E Cadugan
(74) *Attorney, Agent, or Firm*—Thomte, Mazour & Niebergall; Dennis L. Thomte

(57) ABSTRACT

The present invention relates to an electrical terminal implementation device that fabricates individual terminals, positions the terminals at their point of use, and connects the terminals to the subject components. The present device may also include apparatus for attaching the terminals to a component, testing the connection between the terminal and the component, coating the terminals with flux, shaping the terminals, and burnishing the component. More specifically, the present invention includes a terminal feeder by which integrated terminals are fed into the device. The integrated terminals are directed from the feeder toward a punch by a selector assembly. Before an individual terminal is cut from the integrated terminals by the punch, a loader assembly grips the individual terminal. Once separated from the integrated terminals, the individual terminal is moved by the loader assembly to the positioner assembly. The positioner assembly moves the individual terminal to the position where it is to be connected to the subject component. The device also includes an accessory assembly which includes a tool for burnishing the subject component, a camera for visually inspecting the component, and a tester for testing the mechanical and electrical connection between the terminal and the component.

8 Claims, 17 Drawing Sheets

ELECTRICAL TERMINAL IMPLEMENTATION DEVICE

BACKGROUND OF THE INVENTION

I. Field of the Invention

This invention relates to a device that fabricates, positions, and installs electrical terminals to subject components.

II. Description of the Prior Art

Electrical terminals must be connected to certain articles of manufacture to allow for the flow of electricity from one medium to a different medium. This is particularly true in instances where the conductive elements are embedded in a non-conductive material, such as glass or silicone. In, for instance, automotive glass panels having electrical wiring embedded therein for the purpose of defogging the window, electrical terminals must be attached to the glass panels to provide a point of connection for electrical current input and output.

Currently, such terminals are manufactured beginning with the step of obtaining a ribbon of copper, then cleaning, tin-plating, and reeling the ribbon. The ribbon is de-reeled, clad with a solder material on one side, and re-reeled. The ribbon of solder-clad copper is fed into a progressive stamping die that blanks out the flat terminal, then forms the terminal into its final shape. The terminals are connected to a carrier strip that is used to transfer the terminals along the multiple stations of the progressive stamping die. The progressive stamping die cuts the individual terminal off of the carrier strip at its last station. The individual terminals are optionally cleaned and tin-plated to cover the exposed copper where it was cut from the carrier strip. The individual terminals are fed by a vibratory bowl feeder into a machine that applies a flux coating to the solder-clad base of the terminal. The individual terminals are shipped loosely in a container to the fabricator.

At the fabricator, the individual terminals are attached to the subject component, usually by either manual soldering or automated soldering. In manual soldering, the individual terminals are picked at random from the container by the operator and soldered to the appropriate component. In automated soldering, the individual terminals are fed into a vibratory bowl feeder where they are oriented, fed at random into a track, and positioned in a locating fixture from which a robot withdraws the individual terminal. The robot then moves the terminal to the component and positions it to be soldered.

Although this process of production and implementation of electrical terminals is well established, it has several shortcomings that cause defects and unnecessary expense. One shortcoming of the established process is the cost of flux-coating individual terminals. The vibratory bowl feeders into which the individual terminals are loaded are frequently jammed and otherwise prevented from operating properly because the terminals become tangled. Another shortcoming of the established process is the loose packaging of the individual terminals, which causes the flux coating to be damaged. This damage can occur in shipping or in the bowl feeder used to orient the terminals in automated soldering. The damage to the flux coating reduces the ability of the terminal to adhere to the component when it is soldered. A further shortcoming of the established process is that manufacturing lot traceability is not accurate. Terminals placed in vibratory bowl feeders are moved randomly. An individual terminal that is moved through the feeder will have spent an indeterminate amount of time in the feeder.

The longer a terminal spends in the vibratory bowl feeder, the more likely it is to have some or all of its flux coating removed. The problem of flux coating damage is made more difficult to identify if clear flux is used rather than colored flux. Yet another shortcoming of the established process is the expense associated with automated soldering. Separate pieces of machinery are required to orient the terminals and transfer the terminal from the locating fixture to the soldering location. A further shortcoming of the established process is the time and expense required to clean and tin plate the copper ribbon a second time to cover the copper exposed when the individual terminals are cut.

SUMMARY OF THE INVENTION

The present invention relates to an electrical terminal implementation device that fabricates individual terminals, positions the terminals at their point of use, and connects the terminals to the subject components. The present device may also include apparatus for attaching the terminals to a component, testing the connection between the terminal and the component, coating the terminals with flux, shaping the terminals, and burnishing the component.

More specifically, the present invention includes a terminal feeder by which integrated terminals are fed into the device. The integrated terminals are directed from the feeder toward a punch by a selector assembly. Before an individual terminal is cut from the integrated terminals by the punch, a loader assembly grips the individual terminal. Once separated from the integrated terminals, the individual terminal is moved by the loader assembly to the positioner assembly. The positioner assembly moves the individual terminal to the position where it is to be connected to the subject component. The device also includes an accessory assembly which includes a tool for burnishing the subject component, a camera for visually inspecting the component, and a tester for testing the mechanical connection between the terminal and the component. Additional features of the device are contemplated.

It is therefore an object of the invention to provide a device which separates integrated electrical terminals and positions the terminals at a point of use.

It is a further object of the invention to provide a device which selects individual electrical terminals from integrated electrical terminals and implements them without subjecting the individual terminals to bulk storage or shipping.

Yet another object of the invention is to provide a device which prevents damage to the flux coating applied to soldered terminals.

A further object of the invention is to provide a device which allows for the implementation of terminals and the tracing of production lots.

These and other objects of the invention will be apparent to those skilled in the art.

DESCRIPTION OF THE PREFERRED EMBODIMENT

Figure 1:
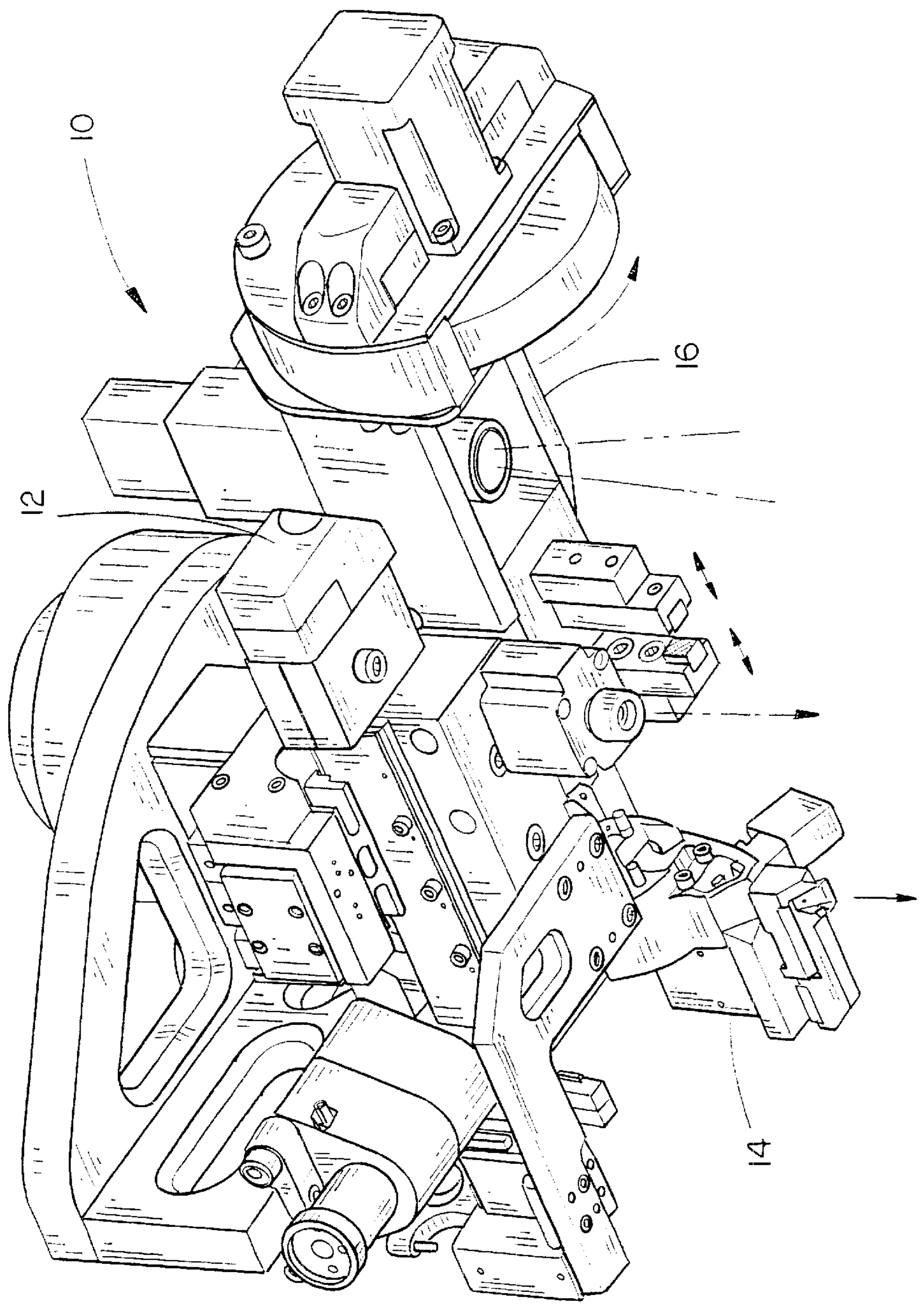
FIG. 1 is an isometric view of the underside of the device.
Figure 2:
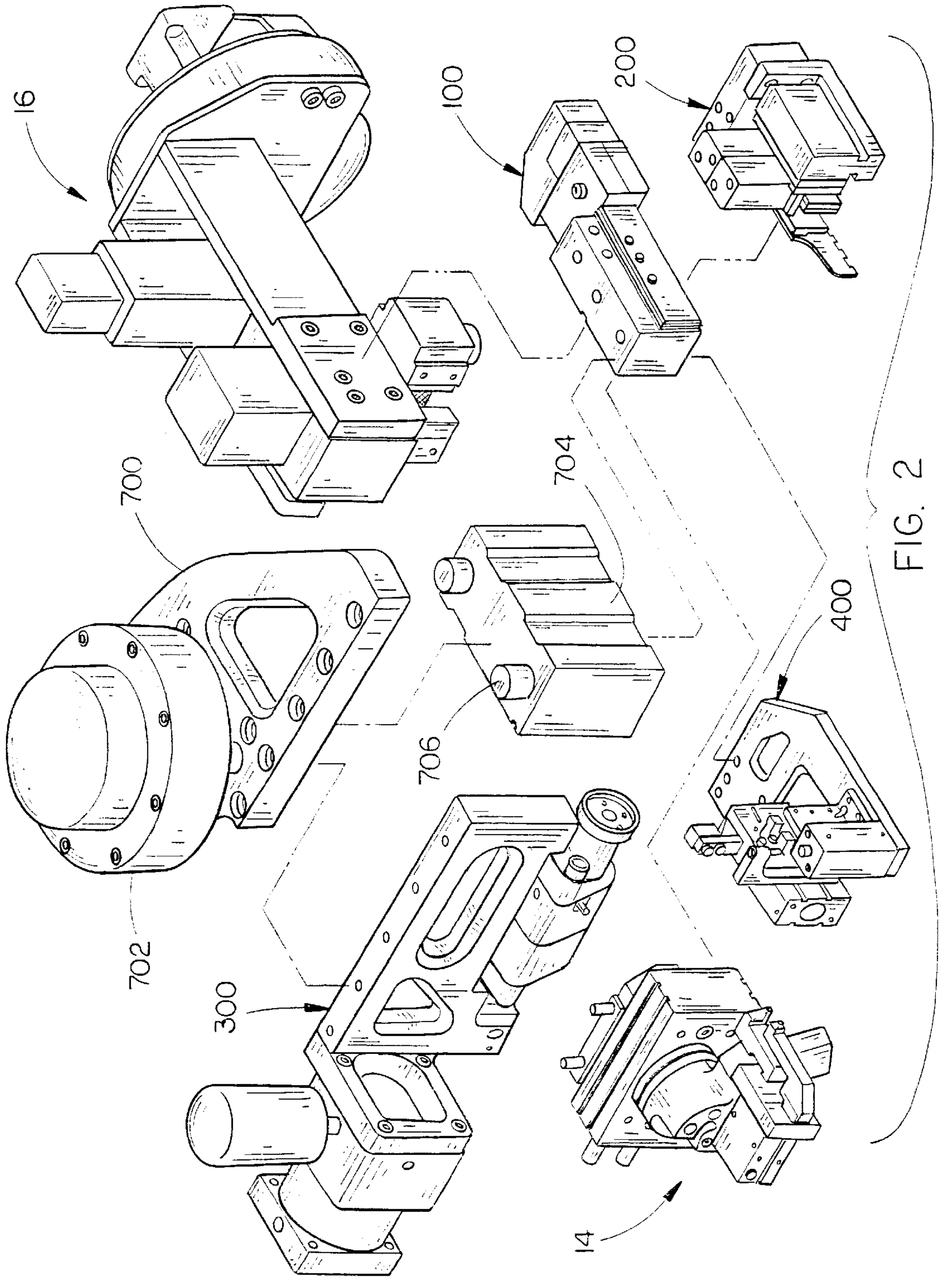
FIG. 2 is an exploded view of the assemblies of the device.

The numeral 10 refers generally to the electrical terminal implementation device of this invention. As shown in FIG. 1, the device 10 includes a feeder assembly 12, a soldering assembly 14, and an accessory assembly 16, each comprising constituent assemblies.

The feeder assembly 12 includes an infeed assembly 100, a selector assembly 200, a press assembly 300, and a loader assembly 400.

Figure 3:
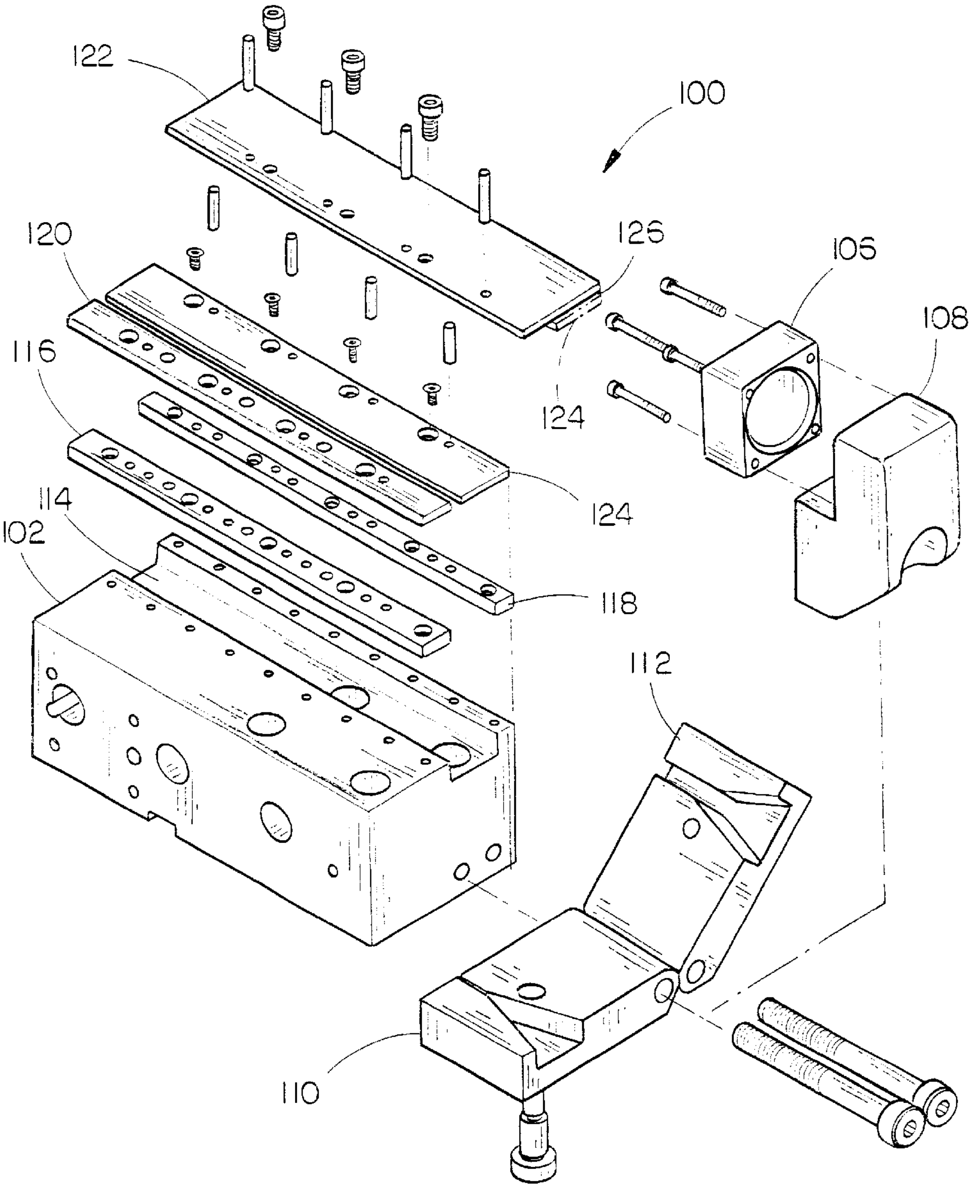
FIG. 3 is an exploded view of the infeed assembly.

The infeed assembly 100 includes an infeed mount 102. As shown in FIG. 3, the infeed mount 102 has attached to one side thereof a feed tube assembly. The feed tube assembly is comprised of feed tube collet 106, feed tube retainer 108, and left and right feed guides 110 and 112. The feed tube assembly directs the integrated electrical terminals 18 through the feed tube collet 106, feed tube retainer 108, and left and right feed guides 110 and 112 into the device 10. The integrated electrical terminals 18 are directed down a groove 114 in the infeed mount 102. The infeed mount 102 has attached to it on either side of groove 114 a heel spacer 116 and a blade spacer 118. The heel spacer 116 supports a heel plate 120, which supports infeed cover 122. The blade spacer 118 supports a blade plate 124. As can be seen in the drawings, the infeed cover 122 extends over the blade plate 124. As is also evident from the drawings, the blade plate 124 is thinner than the heel plate 120 resulting in a gap 126 between the infeed cover 122 and the blade plate 124.

The infeed assembly may also include a conventional shaping device for forming the integrated terminals 18. Such a device (not shown) may be used to form three-dimensional terminals from a flat piece of material. The use of flat integrated terminals would allow for the reduced cost of fabrication and shipping of the terminals. Similarly, three-dimensional terminals may be formed from partially formed integrated terminals. As is known in the art, it is common for electric terminals to have ribs, channels, or the like stamped into the terminals during fabrication. Final shaping of the partially formed terminals may be completed by the conventional shaping device.

Figure 4:
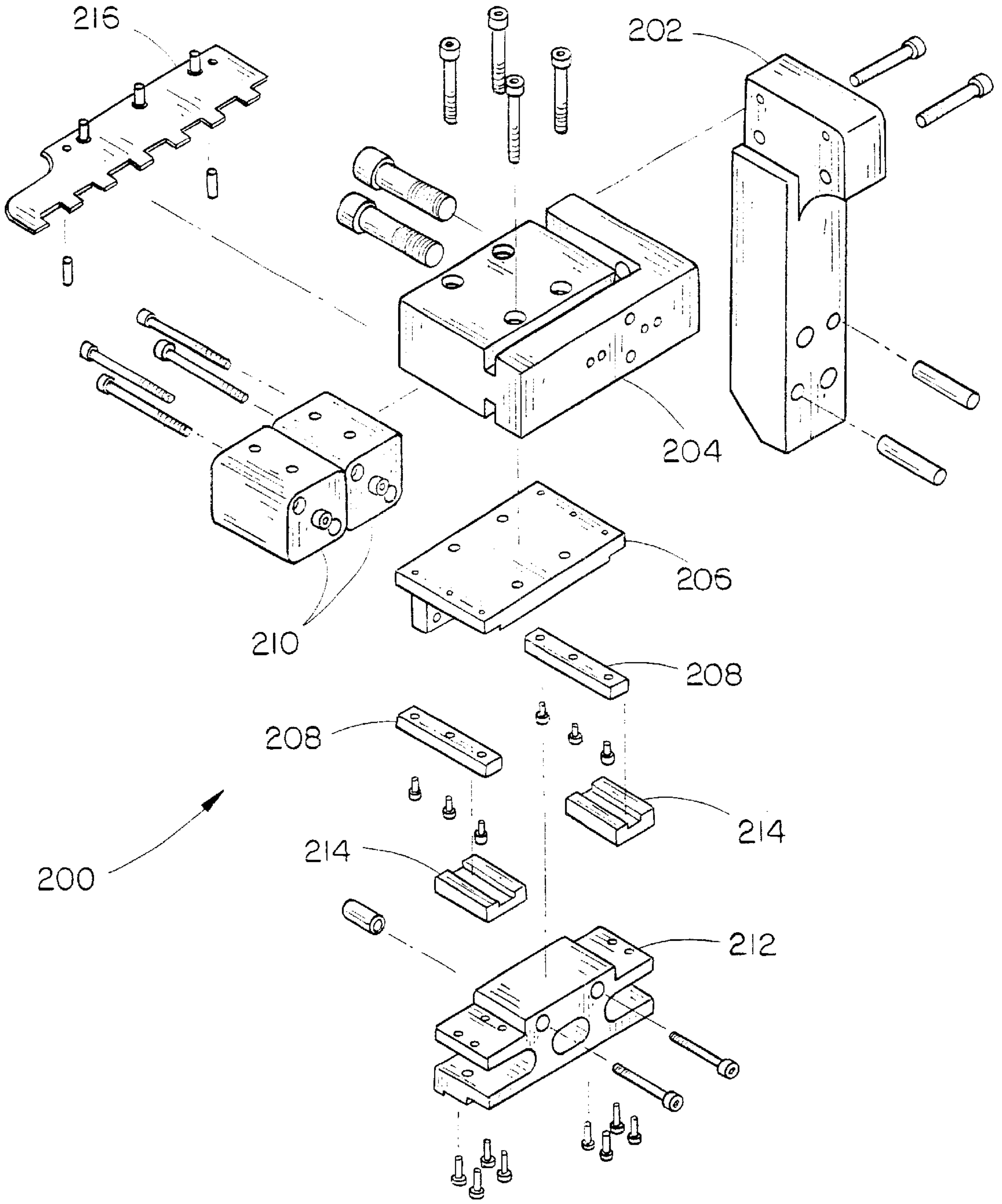
FIG. 4 is an exploded view of the selector assembly.

The integrated electrical terminals 18 are moved through the infeed assembly 100 by the selector assembly 200 which is shown in FIG. 4. The selector assembly 200 includes a selector mount 202, which is attached to the infeed mount 102. An air cylinder linear actuator 204 is mounted on the selector mount 202 and supports a bracket 206 that may be moved toward and away from the selector mount 202. The bracket 206 has mounted to it bearing rails 208 and indexing air cylinders 210. The indexing air cylinders 210 are connected to finger bracket 212, which supports bearing blocks 214 and feed finger 216. The bearing blocks 214 are adapted to slidably engage the bearing rails 208 on the bracket 206. The feed finger 216 is designed with a blade portion 218 that is adapted to fit into the gap 126 of the infeed assembly 100 and engage the integrated electrical terminals 18 therein.

Figure 5:
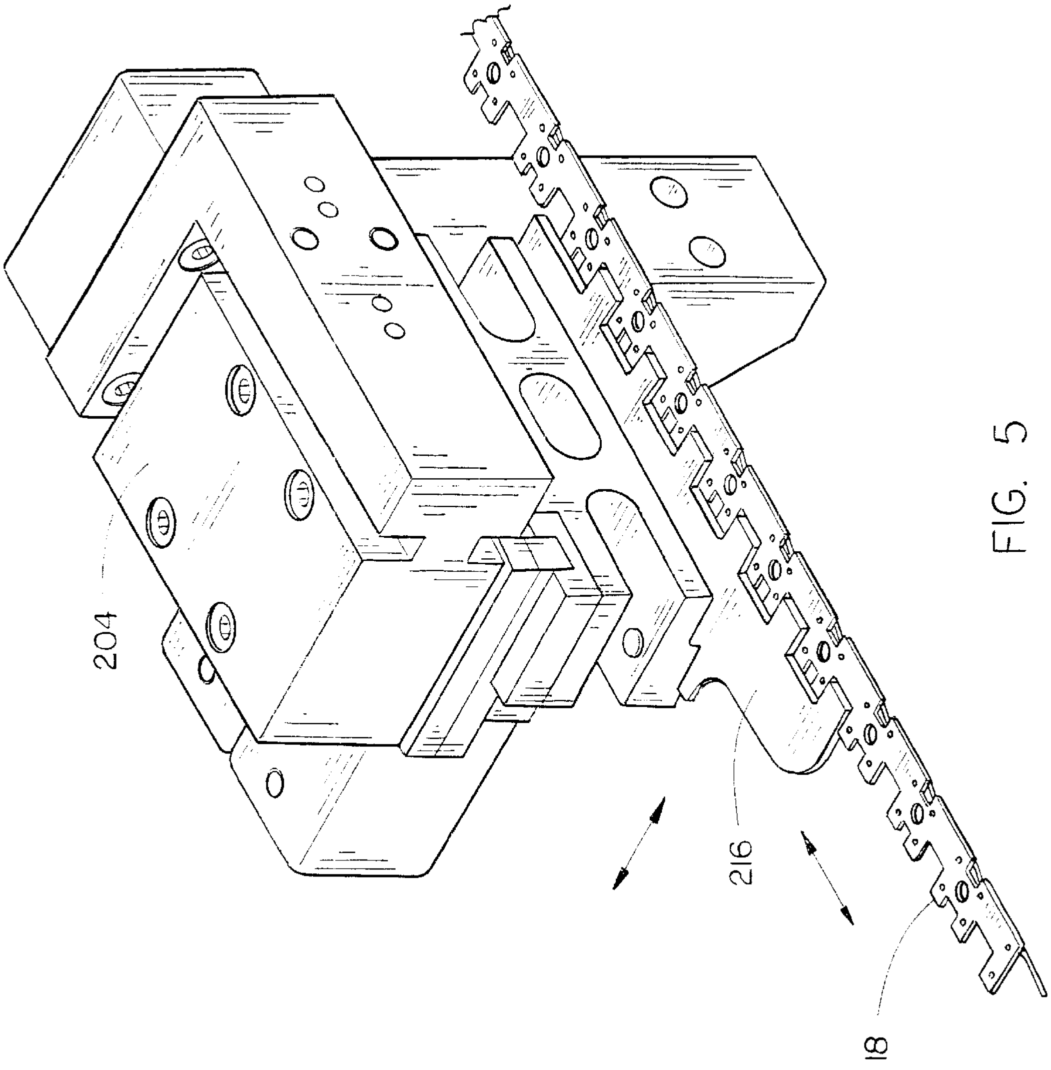
FIG. 5 is isometric view of the selector assembly in engagement with integrated electrical terminals.

The selector assembly 200 works in the following manner. The indexing air cylinders 210 are adapted to move the finger bracket 212 on the bearing rails 208 toward and away from the infeed assembly 100, as shown in FIG. 5. At the start of a cycle, the linear actuator 204 will have drawn the bracket 206 toward the selector mount 202. The indexing air cylinders 210 will have drawn the feed finger 216 away from the infeed assembly 100. The indexing air cylinders 210 will then move the feed finger 216 toward the infeed assembly 100 so that the blade portion 218 will engage the integrated electrical terminals 18 therein. The linear actuator 204 will then move the bracket 206 and, by necessity, the feed finger 216 away from the selector mount 202. This action will move the integrated electrical terminals 18 along the groove 114 in the infeed mount 102. Preferably, the integrated electrical terminals are composed of uniform individual terminals 20 connected by terminal carrier portions 22. The feed finger 216 will, preferably, move the integrated electrical terminals 18 along the groove 114 precisely a distance equivalent to the width of an individual terminal 20 and a terminal carrier portion 22. The indexing air cylinders 210 will then move the feed finger 216 away from the infeed assembly 100 and disengage the feed finger 216 from the integrated electrical terminals 18. The linear actuator 204 will then draw the bracket 206 and the feed finger 216 toward the selector mount 202 to the point of origin. The cycle may then be repeated to continue the movement of the integrated electrical terminals 18 through the device 10.

Figure 6:
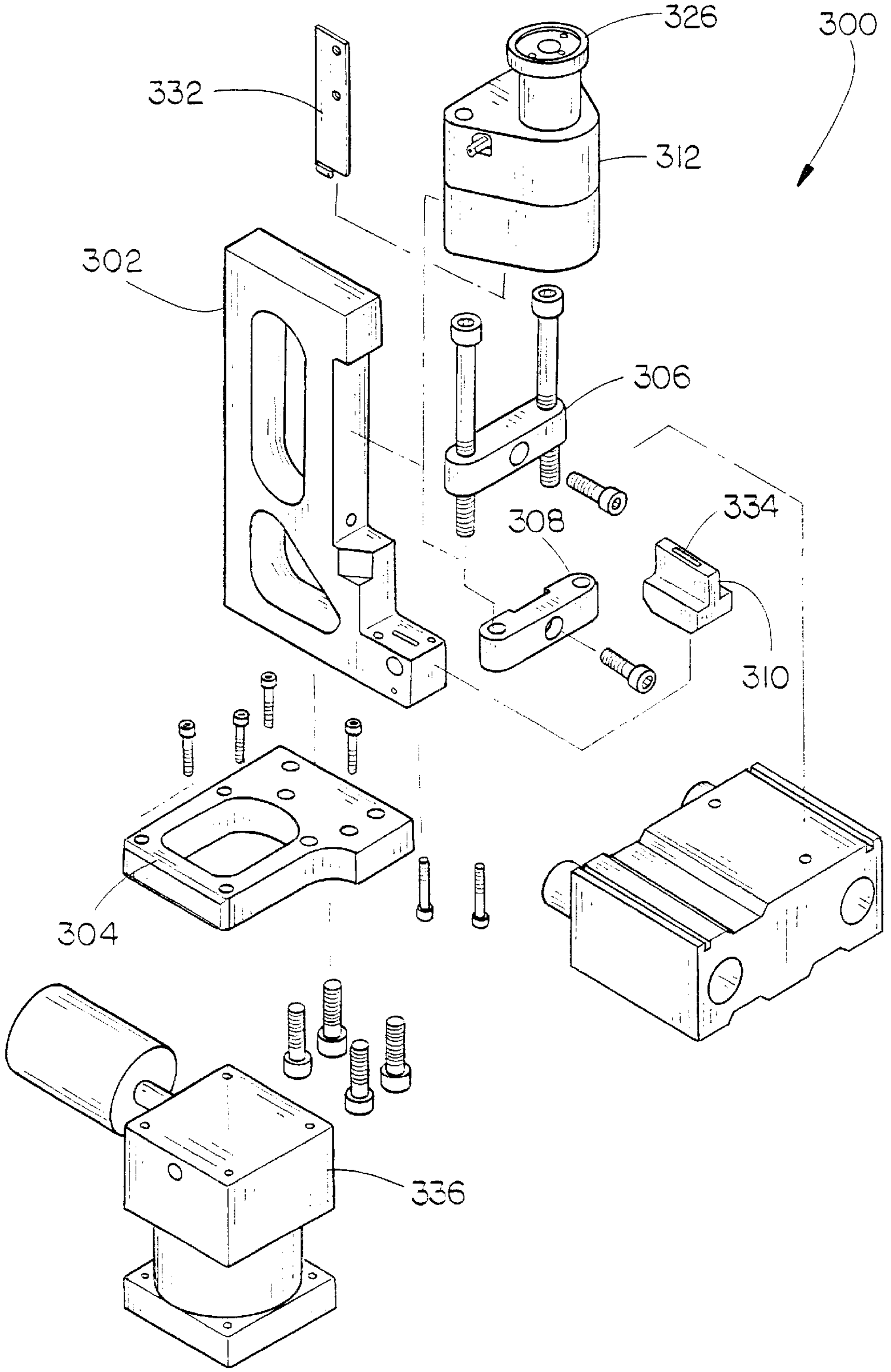
FIG. 6 is an exploded view of the press assembly.
Figure 7:
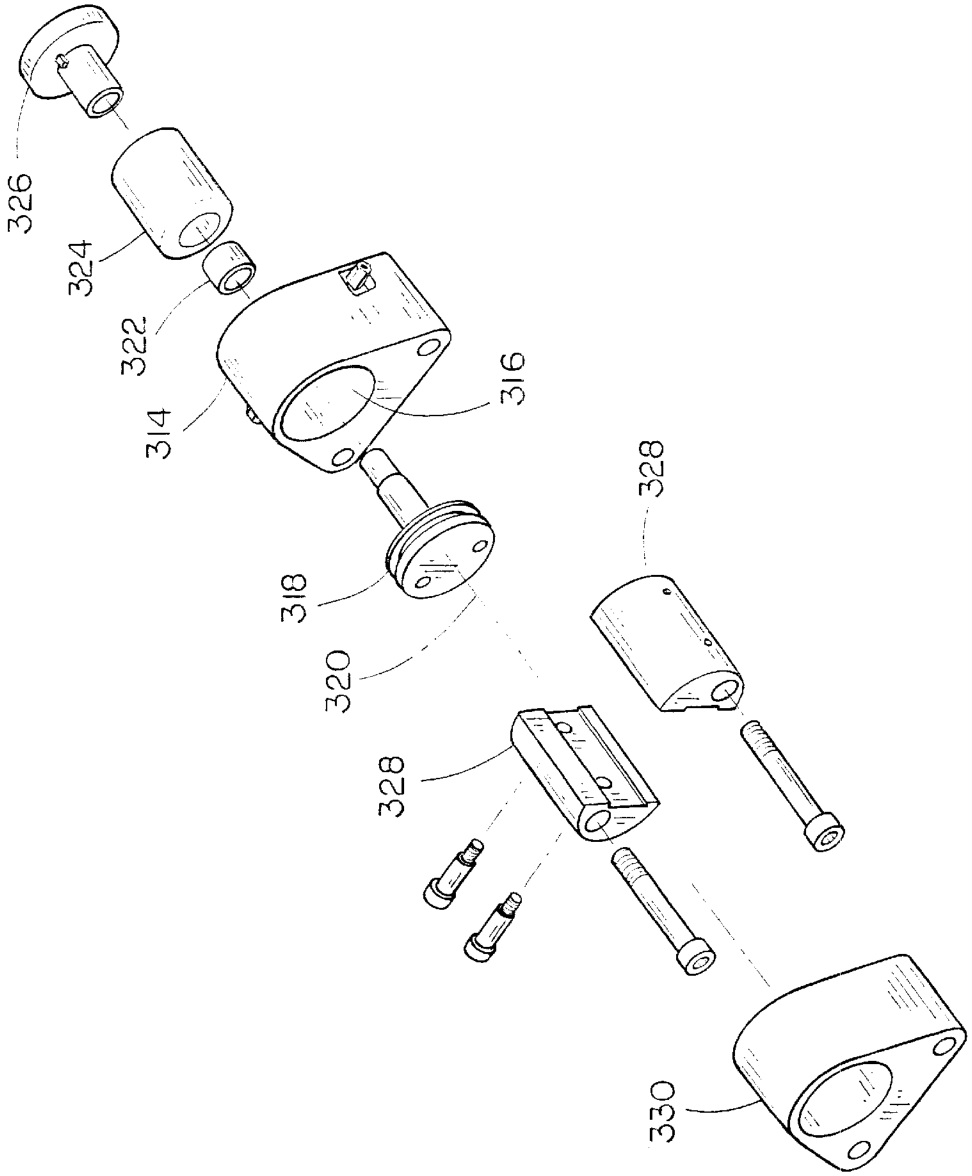
FIG. 7 is an exploded view of the press subassembly.

The infeed assembly 100 and the selector assembly 200 may be implemented to move individual electrical terminals 20 to the loader assembly 400. Preferably, however, the infeed assembly 100 and the selector assembly 200 are designed to move the integrated electrical terminals 18 toward the press assembly 300. The press assembly 300 shown in FIGS. 6–8 includes a press frame 302 mounted on a device mount 700. The press frame 302 has mounted to it a frame brace 304, an upper press mount 306, a lower press mount 308, and a die 310. The upper press mount 306 and the lower press mount 308 are adapted to support a press subassembly 312.

The press subassembly 312 includes a housing 314. The housing 314 has an aperture 316 in which a piston 318 is located. The piston 318 has an axis 320 and can move along the axis 320 within the housing 314. The piston 318 also has a shaft 322 that extends through a spring 324 to a hydraulic cylinder 326. The hydraulic cylinder 326 is adapted to drive the piston 318 along the axis 320 away from a starting position and the hydraulic cylinder 326. The spring 324 is adapted to draw the piston 318 back toward the hydraulic cylinder 326 to the starting position. The piston 318 has mounted to it punch holder blocks 328. The punch holder blocks 328 are housed within spring housing 330 and are adapted to retain a punch 332 therebetween. When the press subassembly 312 is actuated, the punch 332 is driven by the hydraulic cylinder 326 along the axis 320 from a place of origin. The spring 324 then returns the punch to the place of origin. The punch 332 is adapted to fit into an opening 334 in the die 310.

The frame brace 304 supports an air/oil hydraulic intensifier 336. The intensifier 336 is connected to the hydraulic cylinder 326 by a hose (not shown). The intensifier 336 provides sufficient force on the hydraulic cylinder 326 to drive the punch 332 through the material from which the integrated electrical terminals 18 are made and into the die 310, removing carrier portion 22 and producing a separated terminal 20.

Figure 11:
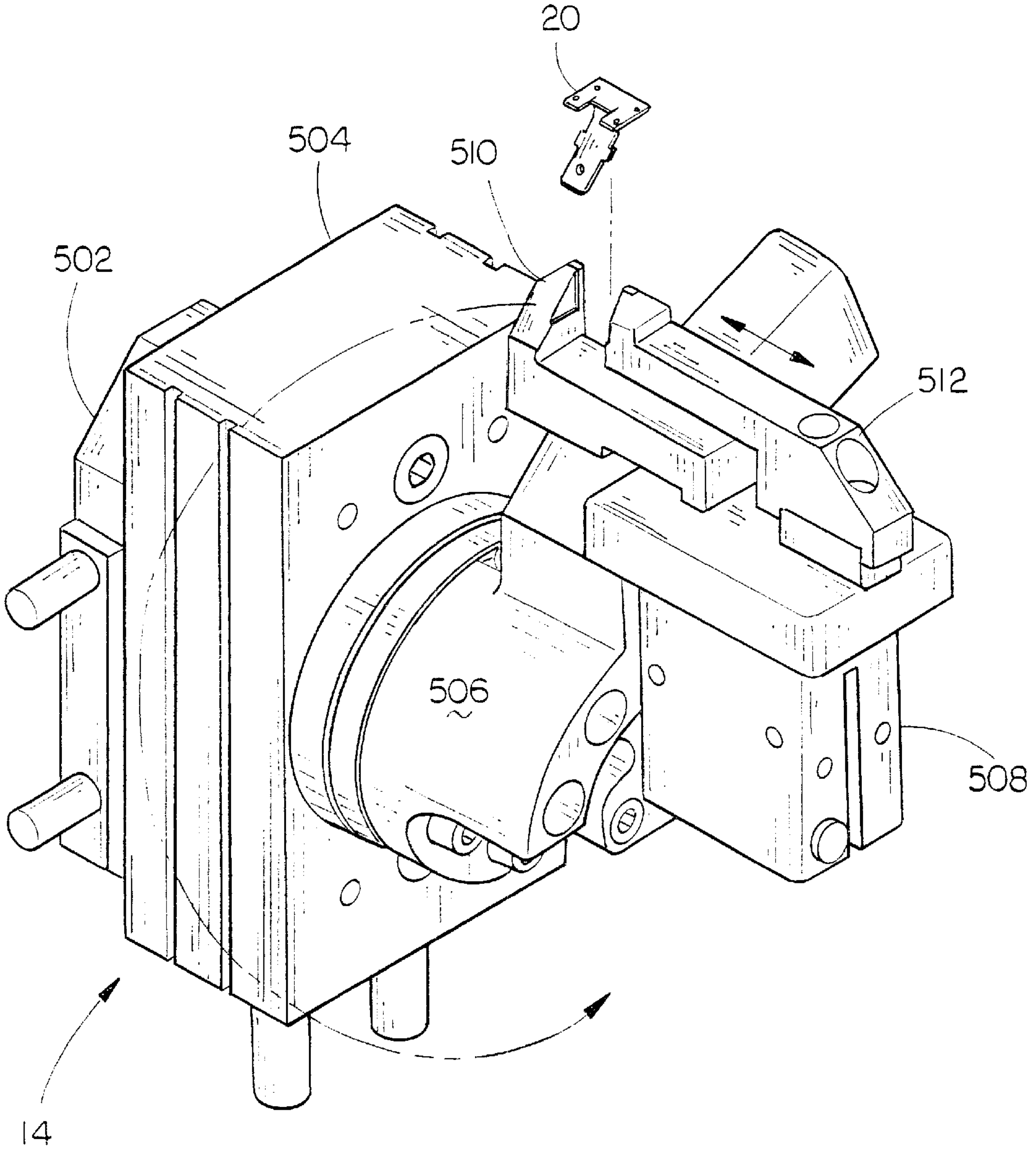
FIG. 11 is an isometric view of the soldering assembly.
Figure 12:
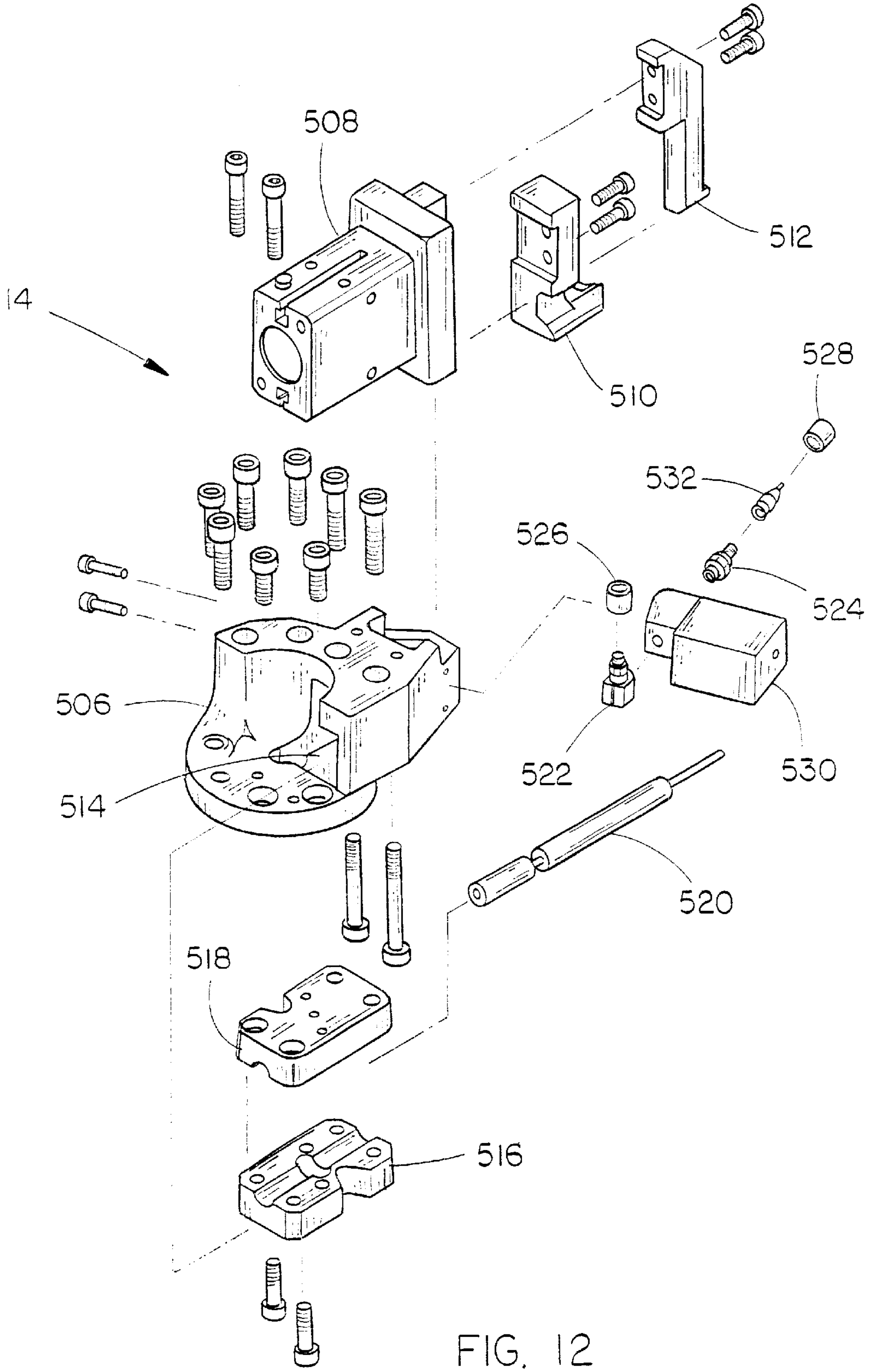
FIG. 12 is an exploded view of the soldering assembly.
Figure 13:
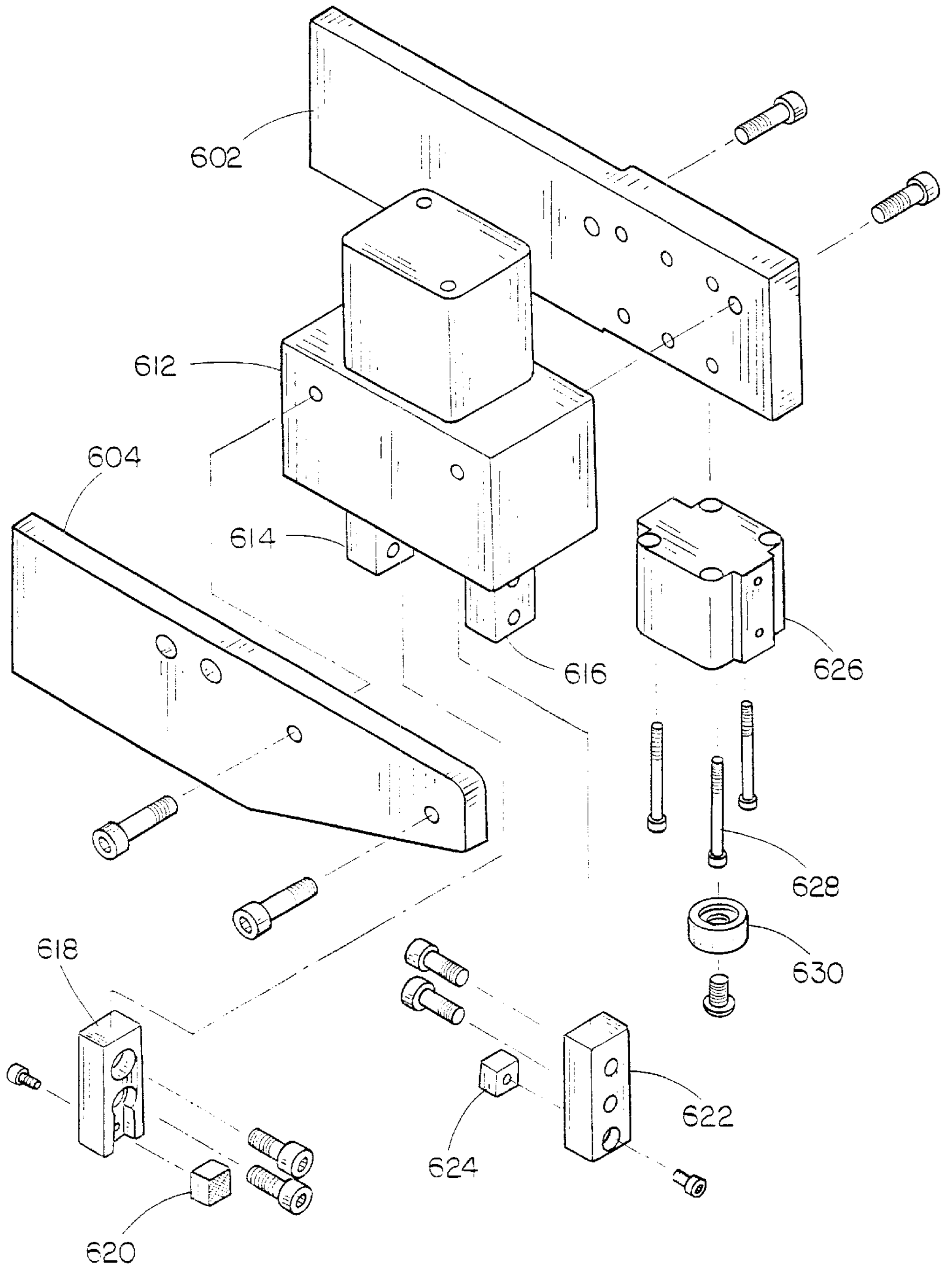
FIG. 13 is an exploded view of the pull test assembly.
Figure 14:
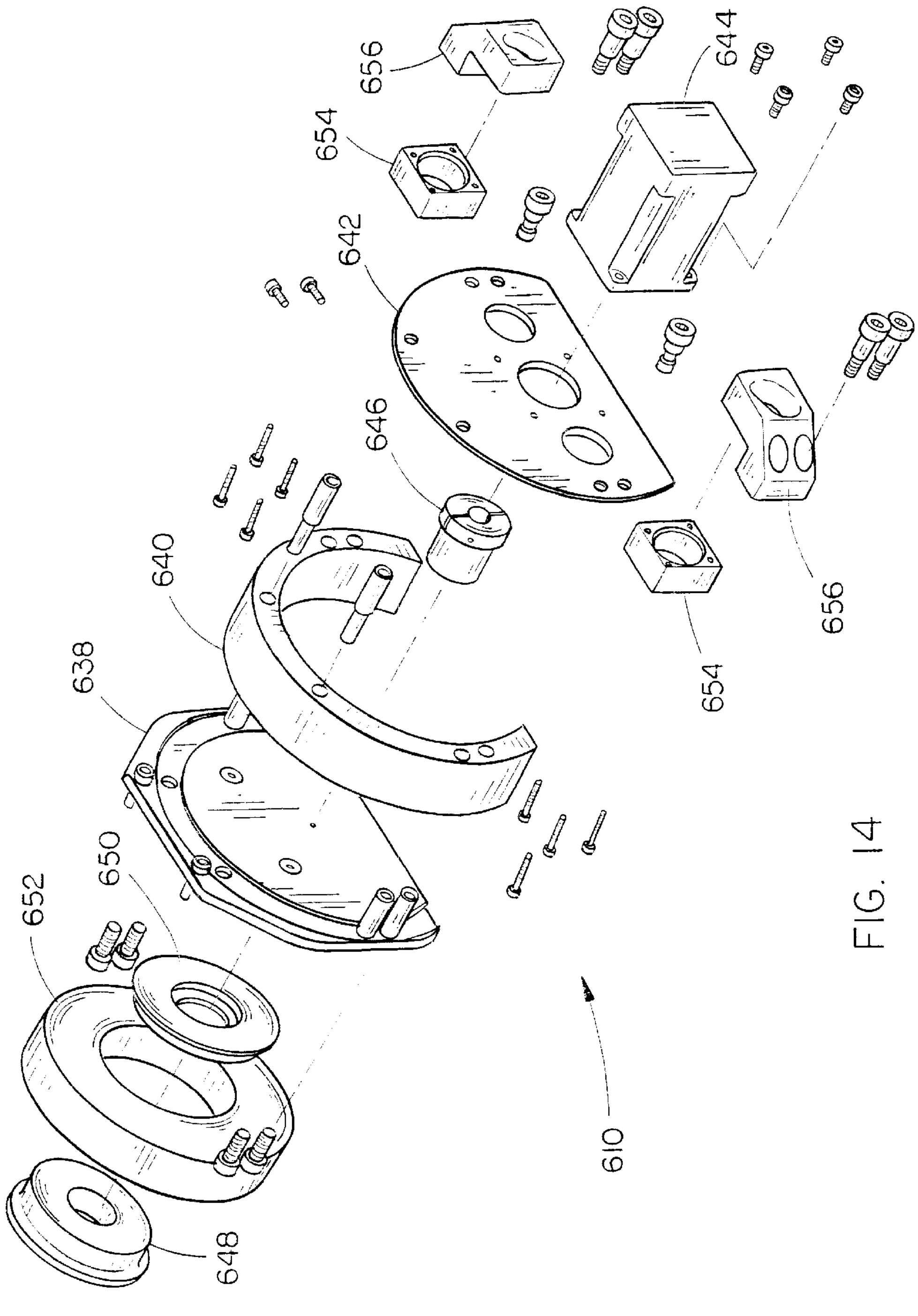
FIG. 14 is an exploded view of the burnishing assembly.

The device 10 includes a loader assembly 400 for the handling of a separated terminal 20. The loader assembly 400 includes a loader mount 402. The loader mount 402 is connected on one end to the infeed mount 102 and, on its other end, has mounted to it a loader bracket 404 and a loading air cylinder 406. The loader bracket 404 has mounted to it loader bearing rails 408. The loading air cylinder 406 is adapted to movably receive a gripper mount 410 such that the gripper mount 410 may move toward or away from the loader mount 402. The gripper mount 410 has attached to it loader bearing blocks 412 and an air actuated gripper 414. The loader bearing blocks 412 are adapted to slidably receive the loader bearing rails 408. The air-actuated gripper 414 includes opposing left and right arms 416 and 418, respectively. Opposing left and right arms 416 and 418 each have connected to it a gripper jaw 420 and 421, respectively. As can be seen in FIG. 11, opposing left and right arms 416 and 418 may be configured in an open position. The air-actuated gripper 414 draws the opposing left and right arms 416 and 418 toward each other so that the gripper jaws 420 and 422 are drawn toward each other. The gripper jaws 420 and 422 are adapted to hold a terminal 20.

Figure 8:
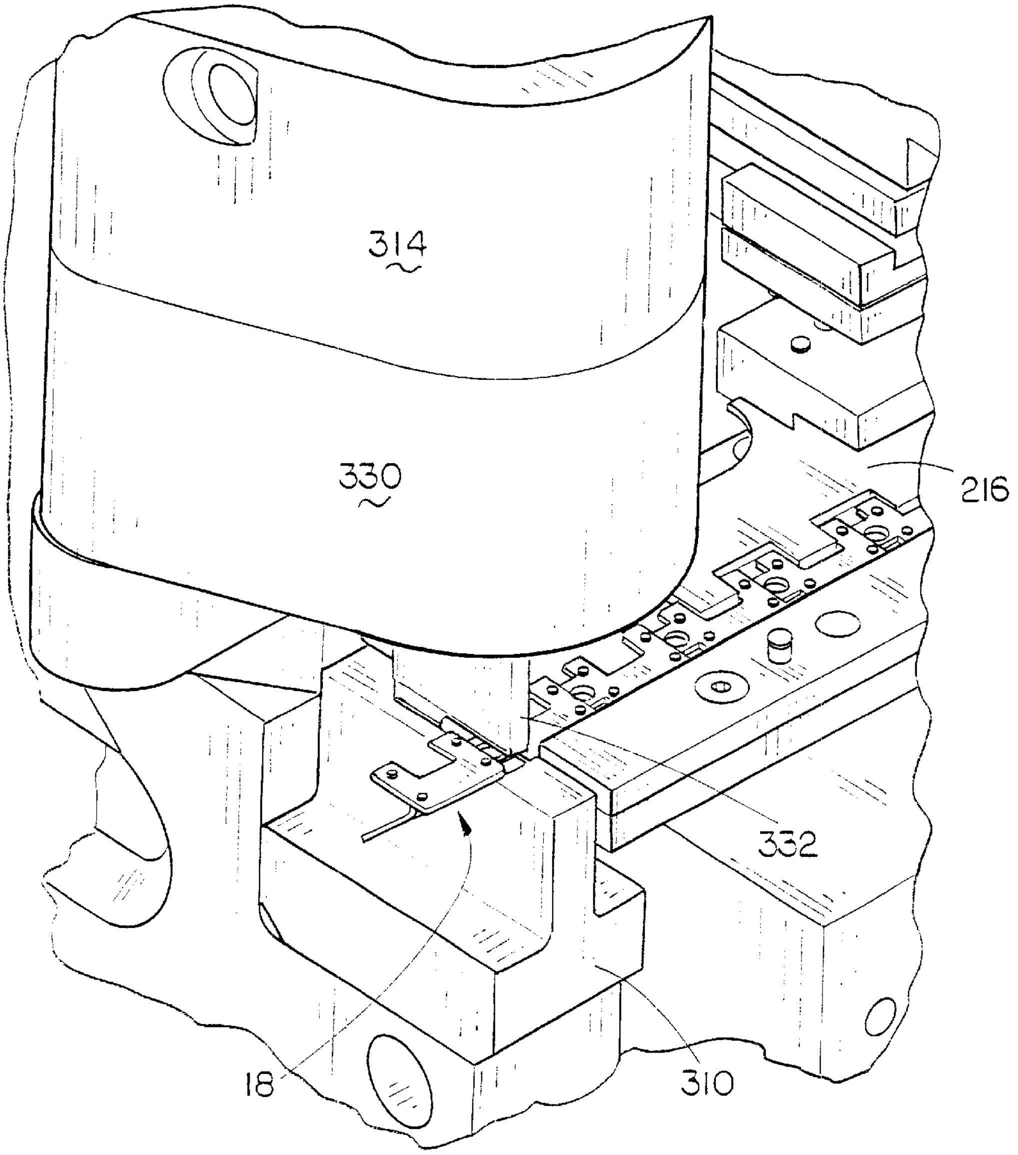
FIG. 8 is an isometric view of the press assembly in relation to the integrated electrical terminals.
Figure 9:
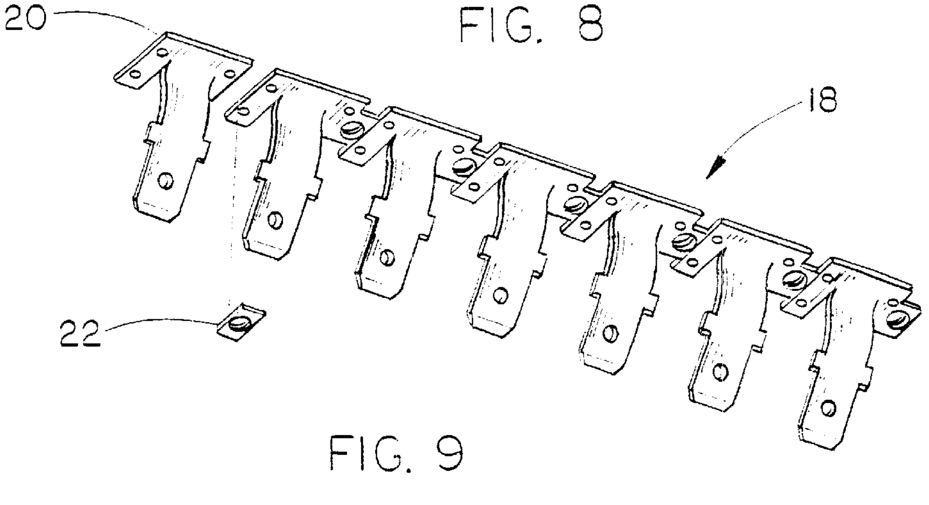
FIG. 9 is an isometric view of the integrated electrical terminals.
Figure 10:
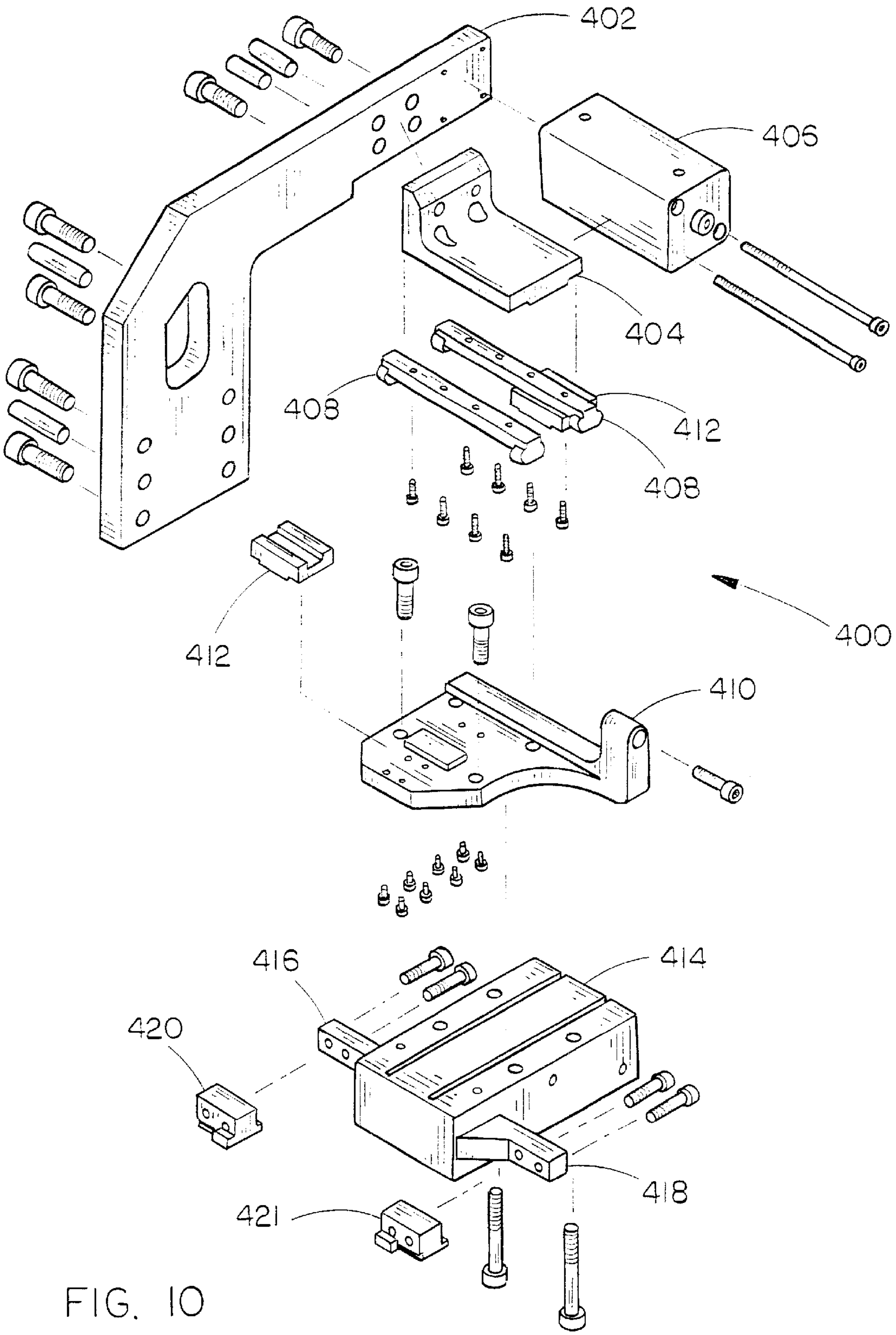
FIG. 10 is an exploded view of the loader assembly.

In operation, the loading air cylinder 406 maintains the gripper mount 410 in a starting position away from the loader mount 402. In the starting position, the opposing left and right arms 416 and 418 are in an open position. The air actuated gripper 414 then draws the opposing left and right arms 416 and 418 toward each other so that the gripper jaws 420 and 422 grip terminal 20 at the end of the integrated electrical terminals 18. The terminal 20 being held by the gripper jaws 420 and 422 is positioned on the downstream side of the die 310. The terminal carrier portion 22 connecting the individual terminal 20 to the remainder of the integrated electrical terminals 18 is positioned directly over the opening 334 of the die 310 by the selector assembly 200 as is seen in FIG. 8. The punch 332 is driven into the die 310, shearing the terminal carrier portion 22 from both the individual terminal 20 and the integrated electrical terminals 18. The gripper mount 410 is then drawn toward the loader mount 402 by the loading air cylinder 406, thereby placing the severed terminal 20 in its point of use, or, alternatively, loading the terminal 20 into a separate apparatus for positioning the terminal 20.

Figure 16:
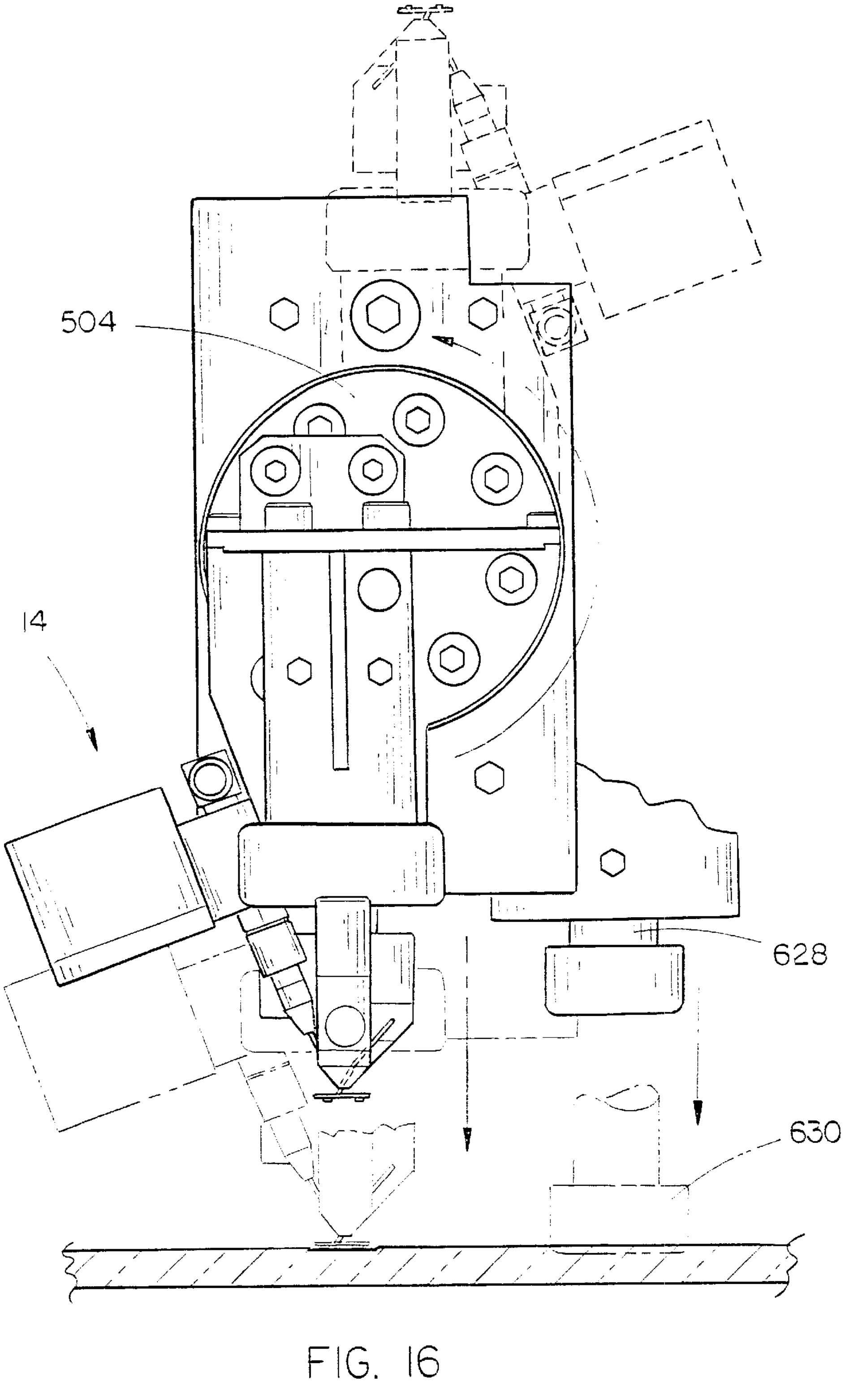
FIG. 16 is a side elevational view of the soldering assembly and pull test assembly and details the manner in which the soldering assembly and pull test assembly are positioned against the subject component.

As seen in FIGS. 1, 11 and 16, the disclosed device includes a soldering assembly 14. The soldering assembly 14 includes a rotator mount 502, which is mounted on the infeed mount 102. An air-actuated rotator 504 is mounted on the rotator mount 502 and has a positioner mount 506 mounted thereon that may be rotated clockwise and counterclockwise with respect to the rotator mount 502. A parallel gripper 508 is mounted on the positioner mount 506 and has attached to it first and second parallel jaws 510 and 512. The parallel gripper 508 is capable of moving the first and second parallel jaws 510 and 512 toward or away from each other. The first and second jaws 510 and 512 are adapted to grab, hold, and release a terminal 20. In the soldering assembly shown in the drawings, the soldering mechanism is an intermittent microflame soldering tool, although it is contemplated that any soldering tool could be employed in the device. In the soldering assembly 14 that is shown, the positioner mount 506 has a cavity 514 therein adapted to receive an electrode base 516 and electrode clamp 518. An electrode 520 is retained between the electrode base 516 and the electrode clamp 518 so that the terminal 20 extends entirely through the cavity 514 to protrude on the opposite side of positioner mount 506. The intermittent microflame soldering tool shown includes fittings 522 and 524, fitting retainers 526 and 528, valve 530, and burner tip 532. The positioner mount 506 may be modified to accept any conventional soldering mechanism.

Figure 15A:
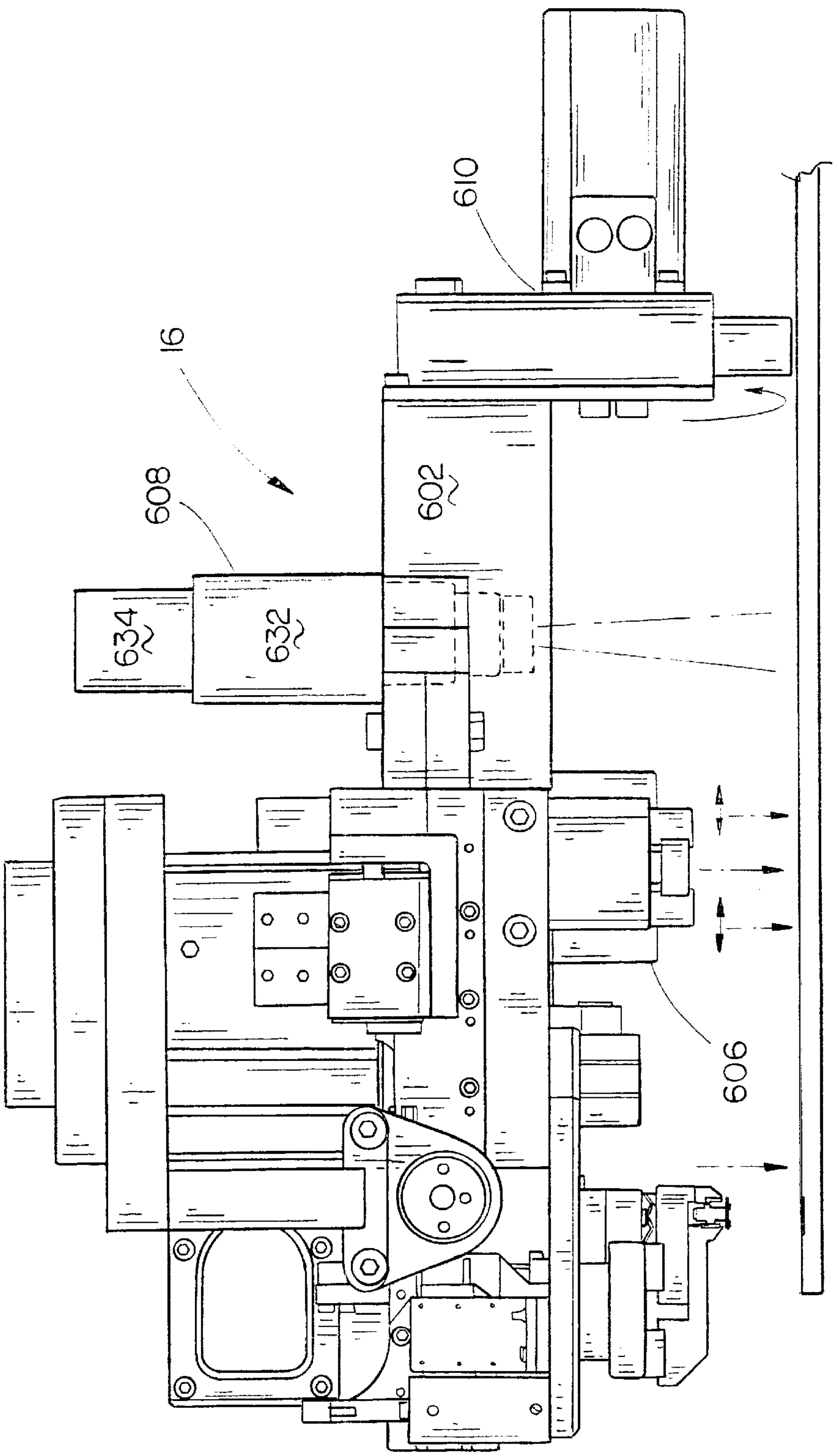
FIG. 15A is a front elevational view of the device in relation to a subject component.
Figure 15B:
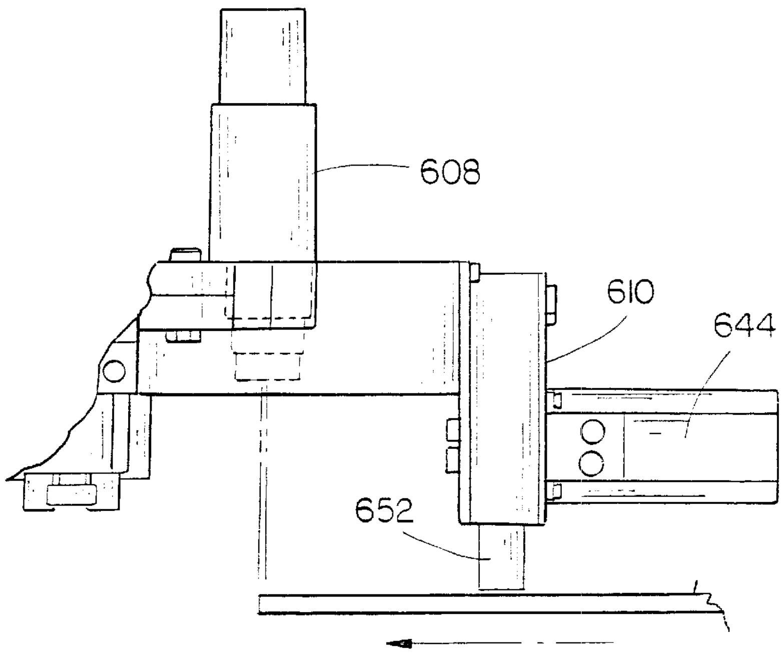
FIG. 15B is a sectional front elevational view of the device and details the manner in which the subject component is positioned relative to the device through the employment of the camera.

In operation, the first and second parallel jaws 510 and 512 are drawn toward each other by the parallel gripper 508 to grasp an individual terminal 20 from the left and right gripper jaws 420 and 422 of the loader assembly 400. The air actuated rotator 504 then rotates the positioner mount 506 so that the first and second parallel jaws 510 and 512 hold the terminal 20 at its point of use, as shown in FIG. 15D. The solder that is integrated with the terminal 20 is then heated by the soldering tool to connect the terminal 20 to the subject component. Preferably, the terminal is fed into the device 10 having not only solder integrated therewith, but also having flux coating applied thereto. The device 10 may also include a conventional apparatus for applying a soldering related material such as a flux coating apparatus (not shown) or a conventional solder paste application apparatus (not shown). The flux coating apparatus or solder paste application apparatus will, preferably, apply materials to the terminal 20 immediately prior to the implementation of the terminal 20.

A number of additional accessories may be incorporated into the device 10. Among the possible accessories are those shown in the accessory assembly 16. As shown, the accessory assembly 16 includes an inner accessory mounting plate 602 and an outer accessory mounting plate 604. The proximal ends of inner and outer accessory mounting plates 602 and 604 have mounted between them a pull test assembly 606. The outer accessory mounting plate 604 has a camera assembly 608 mounted on it. A burnishing assembly 610 is mounted on the distal ends of the inner and outer accessory mounting plates 602 and 604.

The pull test assembly 606 includes air gripper 612. The air gripper 612 has movable opposing arms 614 and 616, respectively, and is adapted to draw the opposing arms 614 and 616 toward and away from each other. Opposing arm 614 has mounted to it gripper block 618 that houses deformable block 620. Opposing arm 616 has a similar gripper block 622 and deformable block 624. An air push rod cylinder 626 is mounted to the underside of the air gripper 612. The air push rod cylinder 626 includes a push rod 628 which has a pad 630 attached to its end.

In operation, the air gripper 612 draws the opposing gripper arms 614 and 616 toward each other so that the deformable blocks 620 and 624 engage a connected electrical terminal 20. The air push rod cylinder 626 is activated so that the pad 630 at the end of the push rod 628 contacts the subject component to lift the device 10 away from the subject component. The movement of the device 10 away from the subject component is restricted by the connection of the electrical terminal 20 to the subject component. If the connection between the terminal 20 and the subject component is strong enough, the device 10 will not move. If, on the other hand, the connection is weak, the force exerted by the air push rod cylinder 626 will disconnect the electrical terminal 20 from the subject component.

The pull test assembly 606 may also include an electrical connection tester (not shown). The electrical connection tester is, preferably, employed in an environment where two of the devices 10 are employed to implement simultaneously electrical terminals 20 in a single circuit. The opposing gripper arms 614 and 616 of each device 10 may be supplied with electrical connections that contact each subject terminal 20 when opposing gripper arms 614 and 616 are drawn toward each other. One of the devices 10 may be adapted to provide an electrical charge that travels through the subject component to the terminal 20 that is in contact with the other of the devices 10. The other of the devices 10 may be equipped with a sensor to determine whether the electrical charge has traveled from one of the subject terminals, through the circuit in the subject component to the other of the subject terminals, indicating a proper electrical connection.

The camera accessory 608 includes a camera mount 632. The camera mount is adapted to support a conventional camera 634. The camera assembly 608 may be used to align the device 10 relative to the subject component prior to attachment of the terminal 20, as shown in FIG. 15B. The camera assembly 608 may also be used to check for proper connection between the individual terminal 20 and the subject component.

The burnishing accessory 610 includes a buffer mount 638. As previously described, the buffer mount 638 is attached to the distal ends of the inner and outer accessory mounting plates 602 and 604. A buffer housing 640 is mounted to the buffer mount 638. A motor mount 642 is mounted to the buffer housing 640 so that the buffer mount 638, buffer housing 640 and motor mount 642 define a semi-circular chamber. An electric motor 644 is mounted on the motor mount 642. An abrasive wheel adapter 646 is operatively connected to the motor 644 and is housed into the chamber formed by the buffer mount 638, the buffer housing 640, and the motor mount 642. The abrasive wheel adapter 646 is adapted to engage outer and inner wheel flanges 648 and 650, respectively. The outer and inner wheel flanges 648 and 650 hold an abrasive wheel 650 therebetween. Rotation of the motor 644 results in the rotation of the abrasive wheel 652. The motor mount 642 may also have attached to it a pair of dust hose collets 654 and dust hose retainers 656. The dust hose collets 654 may be connected to a vacuum device (not shown) to assist in the removal of dust created by the abrasive wheel 652.

Figure 15C:
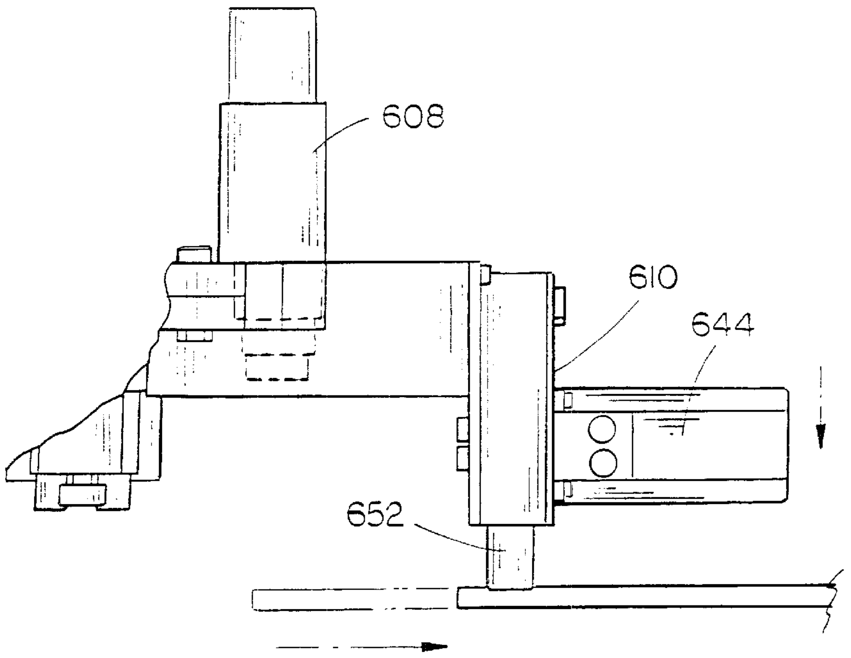
FIG. 15C is a sectional front elevational view of the device and details the manner in which the subject component is positioned relative to the abrasive wheel.
Figure 15D:
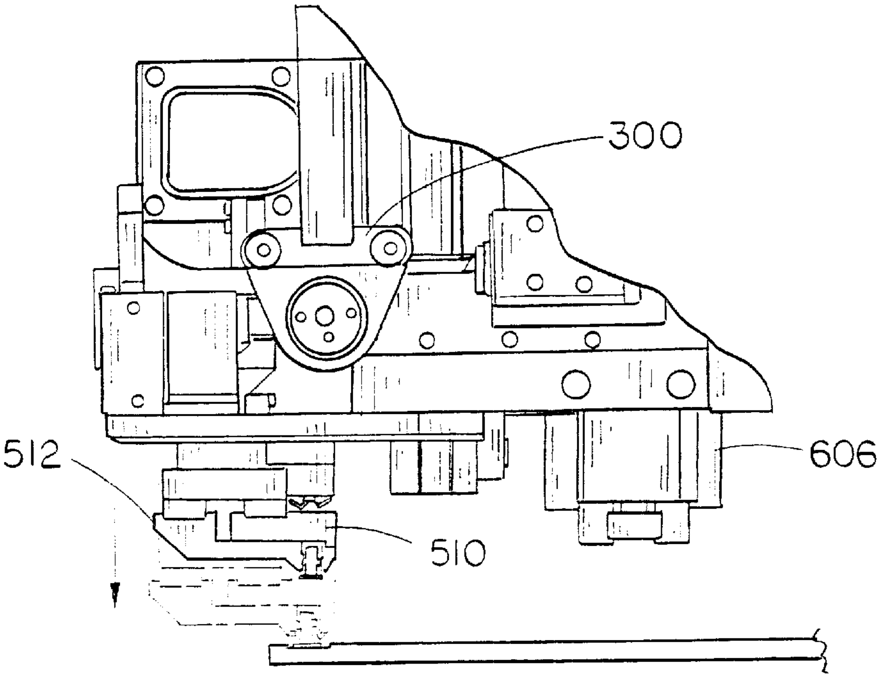
FIG. 15D is a sectional front elevational view of the device and details the manner in which the subject component is positioned relative to the soldering assembly.
Figure 15E:
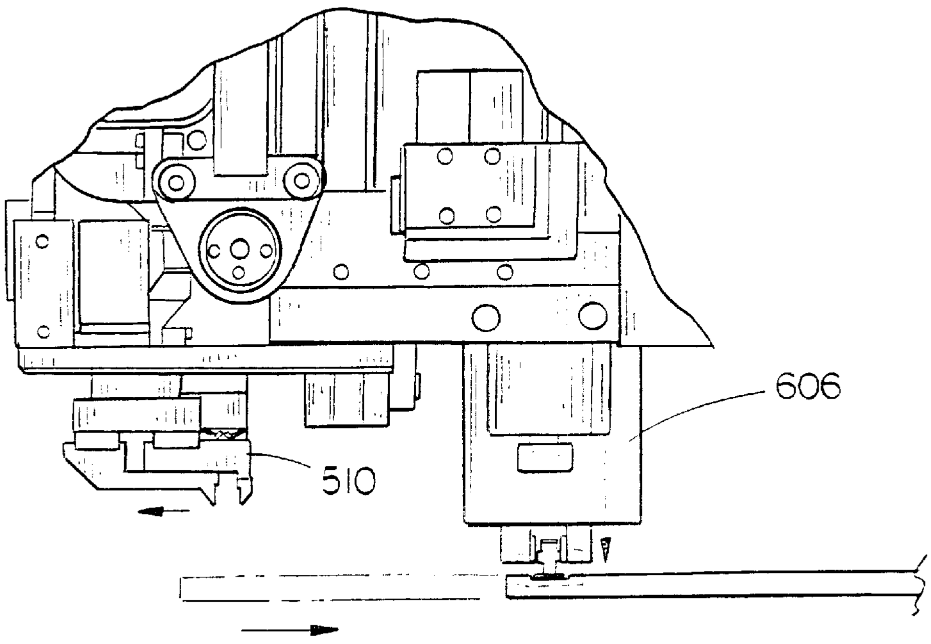
FIG. 15E is a sectional front elevational view of the device and details the manner in which the subject component is positioned relative to the pull test assembly.

In operation, the subject component will be placed under the burnishing accessory 610 prior to the connection of the individual electrical terminal 20 thereto, as shown in FIG. 15C. The abrasive wheel 652 will prepare the surface of the subject component for connection of the individual electrical terminal 20. This will be accomplished by the rotation of the abrasive wheel 652 by the electric motor 644. Dust generated by the contact between the abrasive wheel 652 and the surface of the subject component will be removed from the surface through the dust hose collets 654.

As can be seen from the drawings, the burnishing accessory 610, the camera assembly 608, the pull test accessory 606, and the positioning and soldering assembly 500 are collinear. The device 10 may, therefore, be moved with respect to the subject component by either air cylinders (not shown) or by activation of a robot (not shown).

The accessories need not be positioned on a seperate accessory assembly 16 as shown, but may be incorporated into other structures on the tool. As an example, it is contemplated that the air acuated rotator 504 could be adapted to rotate to any one of four positions. In the first position, the first and second parallel jaws 510 and 512 could be positioned to receive the terminal 20 from the loader assembly 400. In the second position, the burnishing assembly 610 could be positioned to burnish the subject component. In the third position, the terminal 20 could be positioned at its point of use. In the fourth position, the pull test assembly could be positioned to determine the strength of the connection. Obviously, other permutations of the structure could exist, and the above descriptions are not intended to limit the scope of the structure to only the described structures.

Additional conventional accessories are contemplated by this disclosure, such as the electrical connection tester. The accessories shown are merely exemplary and do not constitute an exhaustive list of the possible structures contemplated.

The device 10 as shown is adapted to be mounted on a robotic arm (not shown). Toward this end, the device 10 includes a device mount 700. The device mount is rigidly attachable to the infeed mount 102 and the press frame 302. A device rotator 702 is mounted on the device mount 700. The device rotator 702 is attached to the robotic arm and allows the robotic arm to rotate the device 10 as necessary.

The device 10 also includes a vertical actuator 704. The vertical actuator 704 is attached to the press assembly 300 and the device mount 700. The vertical actuator 704 has at least one air actuated cylinder 706 that is connected to at least one of the infeed assembly 100, the selector assembly 200, the loader assembly 400, the soldering assembly 14 or the accessory assembly 16, but, preferably to the infeed mount 102. The air actuated cylinder 706 is adapted to move the infeed assembly 100, the selector assembly 200, the loader assembly 400, the soldering assembly 14 and the accessory assembly 16 toward and away from the subject component. This movement allows the assemblies that must contact the subject component to do so and also allows the subject component to be moved relative to the device 10 without interference as shown in FIGS. 15B, 15C, 15E and 16. The movement also allows for the movement of integrated electrical terminals 18 having a flange without interference between the flange and the die 310, as shown in FIG. 8.

The integrated electrical terminals 18 are attached to the subject components sequentially, allowing for tracing of production lots and allowing for greater quality control. Furthermore, in instances where flux is applied to the integrated electrical terminals 18 prior to introduction into the device 10, the flux is not removed from the terminal by bulk shipping or production machinery. The quality of the connection between the terminal and the subject component is thereby enhanced.

Thus it can be seen that the invention achieves at least all of the stated objectives.

I claim:

1. A device for operatively connecting electrical terminals to a component, said device including an end effector, said end effector comprising:

a frame;

feeding means operatively connected to the frame for moving a strip of the electric terminals on a path through the end effector;

positioning means operatively connected to said frame for placing at least one of the electrical terminals on the component;

attaching means operatively connected to said frame for operatively securing the at least one electrical terminal to the component:

and means operatively connected to said end effector for orienting a position of said end effector with respect to a position of said component;

said device also including a separating means for separating the electrical terminals from the strip.

2. The device of claim 1 wherein said attaching means secures said electrical terminal to the component by soldering.

3. The device of claim 1 further comprising burnishing means operatively connected to said frame for cleaning the component before said at least one electrical terminal is operatively secured thereto.

4. The device of claim 1 further comprising testing means operatively connected to said frame for testing the mechanical connection between said at least one electrical terminal and the component.

5. The device of claim 1 further comprising testing means operatively connected to said frame for visually verifying a connection between said at least one electrical terminal and said component.

6. The device of claim 1 wherein said electrical terminals are integrated terminals.

7. The device of claim 1 wherein said means for orientating includes rotating means for selectively rotating the end effector with respect to the component.

8. The device of claim 1, wherein said frame is operatively connected to a vertical actuator, having at least one selector assembly;

said vertical actuator being adapted to move the end effector toward and away from the component.

* * * * *